United States Patent
Selvaraj et al.

(10) Patent No.: US 11,293,947 B2
(45) Date of Patent: Apr. 5, 2022

(54) PROBE ON CARRIER ARCHITECTURE FOR VERTICAL PROBE ARRAYS

(71) Applicant: FormFactor, Inc., Livermore, CA (US)

(72) Inventors: Mukesh Selvaraj, San Francisco, CA (US); January Kister, Portola Valley, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 16/858,976

(22) Filed: Apr. 27, 2020

(65) Prior Publication Data

US 2020/0341030 A1 Oct. 29, 2020

Related U.S. Application Data

(60) Provisional application No. 62/839,480, filed on Apr. 26, 2019.

(51) Int. Cl.
*G01R 1/073* (2006.01)
*G01R 1/067* (2006.01)

(52) U.S. Cl.
CPC ..... *G01R 1/07314* (2013.01); *G01R 1/06727* (2013.01); *G01R 1/06738* (2013.01); *G01R 1/07357* (2013.01)

(58) Field of Classification Search
CPC ............ G01R 1/07314; G01R 1/06727; G01R 1/06738; G01R 1/07357; G01R 1/07378
See application file for complete search history.

(56) References Cited

U.S. PATENT DOCUMENTS

| | | |
|---|---|---|
| 5,806,181 A | 9/1998 | Khandros |
| 6,066,957 A | 5/2000 | Van Loan |
| 6,870,382 B2 | 3/2005 | Harris |
| 7,349,223 B2 | 3/2008 | Haemer |
| 9,588,139 B2 | 3/2017 | Fan |
| 2001/0054905 A1 | 12/2001 | Khandros |
| 2002/0153912 A1 | 10/2002 | Di Stefano |
| 2003/0222667 A1 | 12/2003 | Khandros |
| 2006/0261827 A1 | 11/2006 | Cooper |
| 2008/0061808 A1 | 3/2008 | Mok |
| 2008/0278188 A1* | 11/2008 | Chung ............... G01R 1/07342 324/756.03 |

(Continued)

FOREIGN PATENT DOCUMENTS

EP 0180013 5/1986

*Primary Examiner* — Lee E Rodak
(74) *Attorney, Agent, or Firm* — Lumen Patent Firm

(57) ABSTRACT

A probe-on-carrier architecture is provided, where several vertical probes are disposed on each probe carrier and the probe carriers are affixed to the space transformer. Each vertical probe has two flexible members. The first flexible member makes electrical contact to the space transformer. The second flexible member makes temporary electrical contact to the device under test. A mechanical stiffener can be used to deal with the possible lack of flatness and thermal expansion of the space transformer. The mechanical stiffener can be affixed to the space transformer to bring the flatness and thermal expansion of the space transformer to within specifications. Alternatively, the mechanical stiffener can be affixed to the space transformer without trying to bring the flatness and thermal expansion of the space transformer to within specifications.

8 Claims, 4 Drawing Sheets

(56) References Cited

U.S. PATENT DOCUMENTS

| | | |
|---|---|---|
| 2009/0142707 A1 | 6/2009 | Eldridge |
| 2010/0134127 A1* | 6/2010 | Breinlinger ........ G01R 31/2889 |
| | | 324/756.03 |
| 2010/0176831 A1 | 7/2010 | Palcisko |
| 2011/0025361 A1 | 2/2011 | Miller |
| 2011/0121851 A1* | 5/2011 | Lee .................... G01R 1/07371 |
| | | 324/756.03 |
| 2015/0198633 A1* | 7/2015 | Rizza ................. G01R 1/07378 |
| | | 324/754.18 |
| 2016/0377656 A1 | 12/2016 | Liberini |
| 2019/0064220 A1* | 2/2019 | Eldridge ............ G01R 1/07371 |

\* cited by examiner

PROBE ON CARRIER ARCHITECTURE FOR VERTICAL PROBE ARRAYS

CROSS REFERENCE TO RELATED APPLICATIONS

This application claims the benefit of U.S. provisional patent application 62/839,480, filed on Apr. 26, 2019, and hereby incorporated by reference in its entirety.

FIELD OF THE INVENTION

This invention relates to probe arrays for testing electrical devices and circuits.

BACKGROUND

Testing of electrical devices and circuits is often performed with probe arrays that make multiple temporary electrical contacts to the device under test. There is an ever increasing demand for larger and larger probe arrays, as device size and complexity increase, and as wafer-scale testing becomes more common. The conventional architecture of probe arrays is simple: a space transformer provides a mechanical support for mounting of the probes, and also provides electrical connections between the probes and the rest of the test apparatus.

However, this simple architecture can be problematic for probe arrays with thousands of probes or more. Assembly time is one such problem, since population of the space transformer with a large number of probes is typically a very time consuming process, even with robotic pick and place technology. Another problem is that there are stringent requirements for flatness of the probe array tips, which results in corresponding requirements on the space transformer flatness and on space transformer thermal expansion. The resulting combined design constraints on the space transformer can be formidable. Accordingly, it would be an advance in the art to alleviate these problems.

SUMMARY

In this work, a probe-on-carrier architecture is provided, where several probes are disposed on each probe carrier and the probe carriers are affixed on or in proximity to the space transformer. Each probe has two flexible members. The first flexible member makes electrical contact to the space transformer. The second flexible member makes temporary electrical contact to the device under test.

In preferred embodiments, a mechanical stiffener is used to deal with the possible lack of flatness and thermal expansion of the space transformer. Two exemplary ways of making use of such a stiffener are described in detail below. In the first approach, the mechanical stiffener is affixed to the space transformer to bring the flatness and thermal expansion of the space transformer to within specifications, and the probe carriers are disposed on the space transformer.

In the second approach, the mechanical stiffener is affixed to the space transformer without trying to bring the flatness and thermal expansion of the space transformer to within specifications, and the probe carriers are disposed on the stiffener. Here the first flexible members of the vertical probes are configured to accommodate both thermal expansion of the space transformer and deviation of the space transformer from flatness.

Assembly time is reduced, since the number of assembly operations required to populate a space transformer with probe carriers is much less than that needed to populate a space transformer with individual probes. Furthermore, probe carriers can be populated with probes in parallel.

DETAILED DESCRIPTION

Figure 1A:
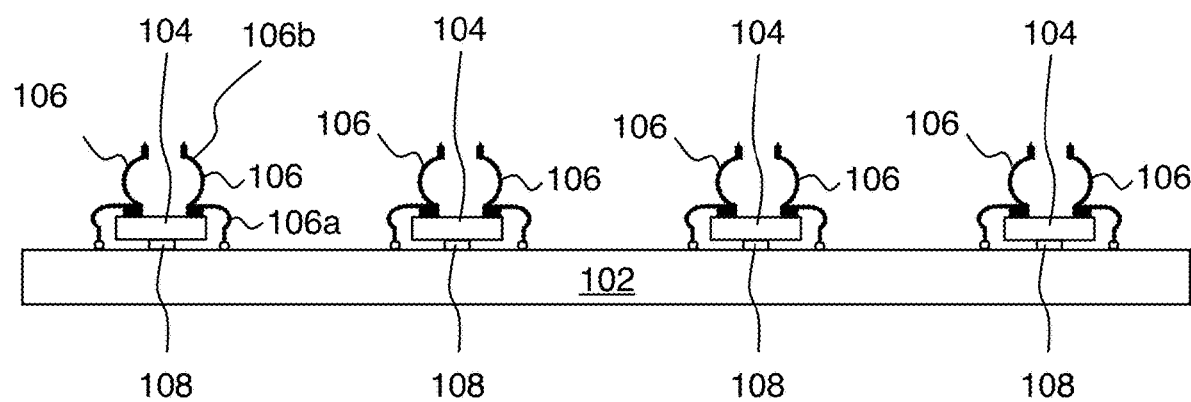
FIGS. 1A-B show a first embodiment of the invention.
Figure 1B:
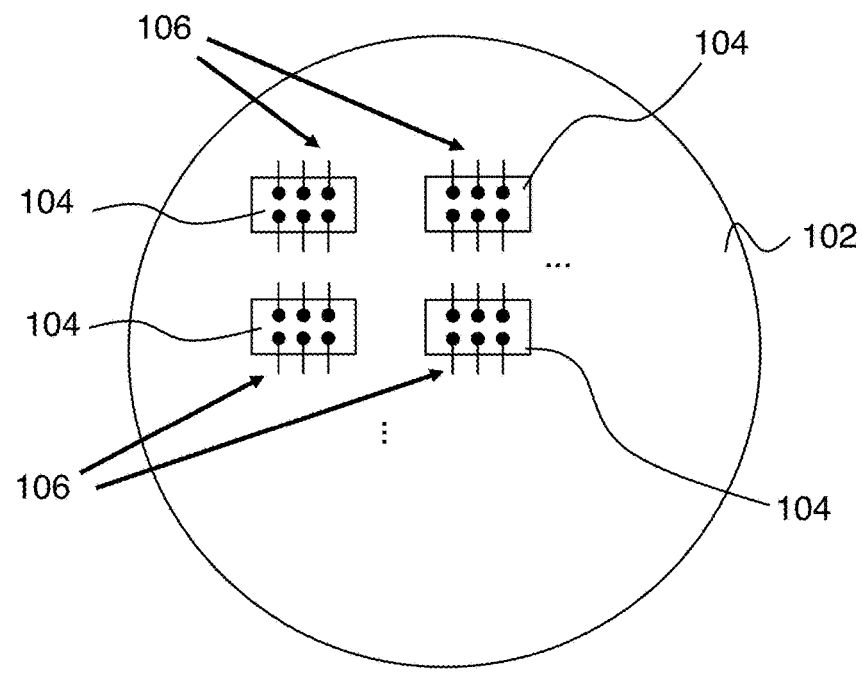

FIGS. 1A-B show a first embodiment of the invention. Here FIG. 1A is a side view and FIG. 1B is a schematically corresponding top view. The probe array of this example includes a space transformer 102 and two or more probe carrier plates 104 disposed on or in proximity to the space transformer. Each probe carrier plate 104 has two or more vertical probes 106 disposed on it.

Each vertical probe includes a first flexible member (e.g., 106a) that makes electrical contact to the space transformer and a second flexible member (e.g. 106b) configured to make temporary electrical contact to a device under test. To reduce clutter on FIG. 1A, these features are shown for all probes but only referenced on one of the probes. Probe carrier plates 104 are affixed to space transformer 102 via bonds 108.

The overall architecture of this probe array is best understood by reference to FIG. 1B. This figure shows multiple probe carrier plates 104, each disposed on the space transformer 102. Probes 106 are disposed on the probe carrier plates 104 (e.g., as shown) and the first flexible members of the probes make electrical contact to space transformer 102. Any number of probe carrier plates 104 can be disposed on space transformer 102. Practice of the invention does not depend critically on the lateral arrangement of probe carrier plates 104 on space transformer 102. The examples in this description show a regular array of probe carrier plates 104 on space transformer 102, but that is not required. Similarly, practice of the invention does not depend critically on the number or arrangement of probes 106 on the probe carrier plates 104.

The space transformer can include a ceramic substrate. Alternatively, the space transformer can include a printed circuit board substrate. Preferably tips of the second flexible members of the vertical probes are flat to a tolerance of 25 microns or less.

As indicated above, achieving this level of flatness can be challenging in practice. For the example of FIGS. 1A-B, space transformer 102 provides the required flatness. This can be done with a mechanically stable space transformer (e.g., on a ceramic substrate). However, it is often preferable to make the space transformer using different technology (e.g., printed circuit boards (PCB)), and here special measures are usually needed to provide probe tip flatness. The flatness of printed circuit boards is typically 0.5 mm to 1 mm over a 300 mm range. There are also CTE (coefficient of thermal expansion) issues to consider for PCB space transformers.

More specifically, PCBs typically have somewhere between 10-50 layers where the core and pre-impregnation materials used have CTEs of about 4 ppm/C. Conventional PCBs also include several metal layers of Cu for ground, signal, and power plane (electrical paths/connectivity), but the CTE of Cu is around 16 ppm/C. Cu and other metals within the PCB layers account for around 40-60% of the entire CTE stack up excluding core and pre-impregnation materials. Detailed calculations have shown that achieving a composite CTE of the PCB of 4 ppm/C will be very challenging with these conventional materials. We have found the composite final CTE of such a PCB will typically be around 6-8 ppm/C.

Devices under test (DUT) are typically Si wafers and the CTE of Si is 2.7 ppm/C. That means there will be a large CTE mismatch between the DUT and the composite PCB such that the probes may not make proper contact to the device pads during hot and cold testing. E.g., a typical testing temperature range can be from −40 C to 150 C. Also PCBs are usually not flat. They typically have around 500 um-1 mm flatness after fabrication. As indicated above, the probe tips should preferably be within 25 um flatness to make good contacts to contact pads of devices under test.

To alleviate this CTE difficulty, Copper traces in a PCB can be replaced with low CTE metals like Beryllium, Rhodium, Nickel based alloys etc. that have CTE around 4-5 ppm/C.

Motivated by these considerations, preferred embodiments include a mechanical stiffener member in the probe array. There are two ways such a mechanical stiffener member can be used. In the first approach (FIGS. 2A-B), the mechanical stiffener member is affixed to the space transformer to bring the flatness and thermal expansion of the space transformer to within specifications, and the probe carrier plates are disposed on the space transformer. In the second approach (FIGS. 3A-B), the mechanical stiffener member is affixed to the space transformer without trying to bring the flatness and thermal expansion of the space transformer to within specifications, and the probe carrier plates are disposed on the mechanical stiffener member.

Figure 2A:
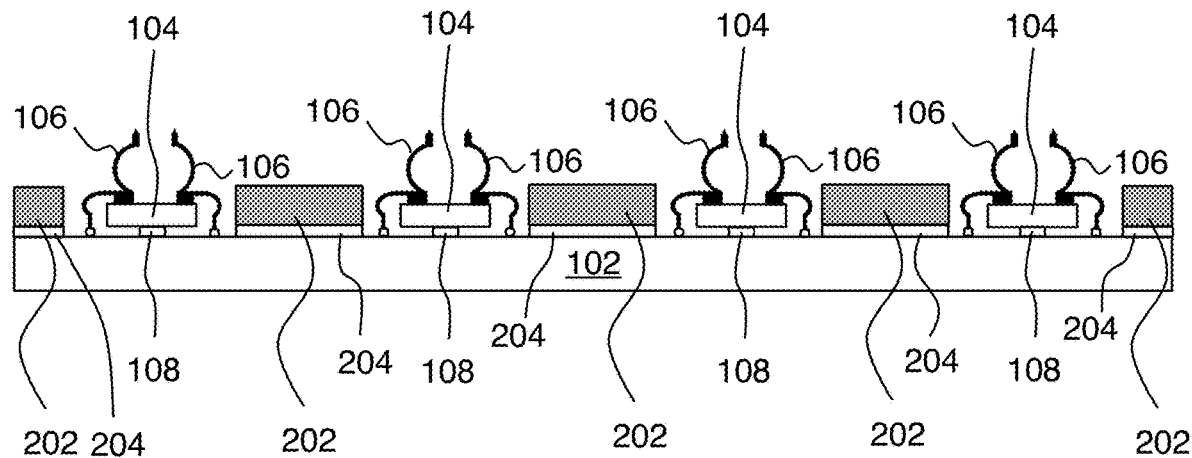
FIGS. 2A-B show a second embodiment of the invention.
Figure 2B:
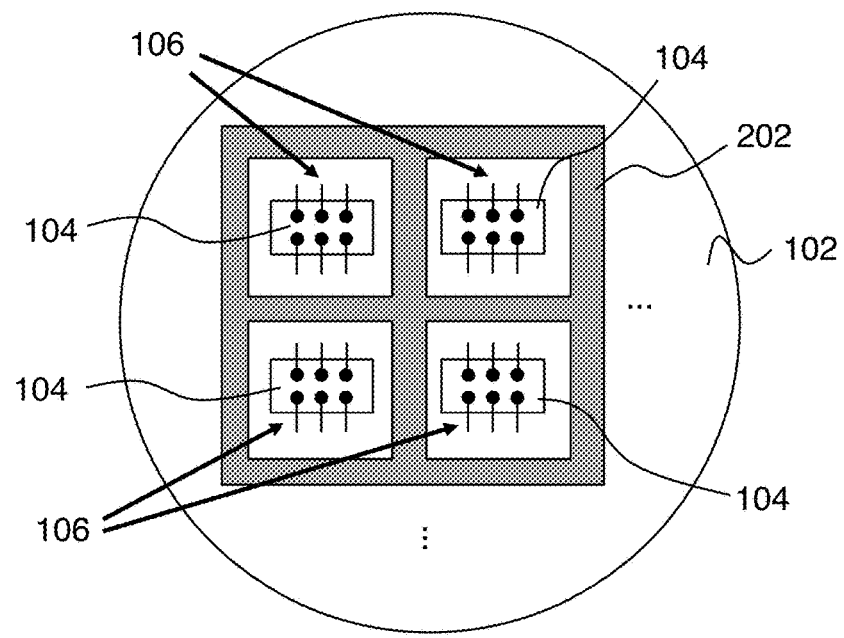

FIGS. 2A-B show a second embodiment of the invention. Here FIG. 2A is a side view and FIG. 2B is a schematically corresponding top view. This is similar to the example of FIGS. 1A-B except that mechanical stiffener member 202 is added to the probe array as shown. Mechanical stiffener 202 is affixed to space transformer 102 with bonds 204. Here probe carrier plates 104 are disposed on the space transformer 102.

Mechanical stiffener member 202 is configured to constrain both thermal expansion of the space transformer and deviation of the space transformer from flatness. Mechanical stiffener member 202 can be made of a low CTE metal or glass or ceramic stiffener with a CTE lower than 4 ppm/C. Suitable metals include, but are not limited to: Invar 36 and Super Invar. Suitable ceramics include, but are not limited to: Photoveel™, Silicon Nitride, and Glass mullite. Suitable glasses include, but are not limited to: Boro-silicate, Borofloat, Quartz, Pyrex™, and Zerodur™.

Mechanical stiffener member 202 can be affixed to space transformer 102 with non-conductive adhesives, mechanical features like M2/M3 screws or the like. Practice of the invention does not depend critically on how this bonding is done.

By affixing a stiffener to a PCB space transformer as described above, the PCB flatness can be improved from 500 um-1 mm to 50 um-100 um (about a 10× improvement). Pick and place robotic technology for bonding the probe carrier plates 104 to the space transformer 102 can be used to achieve a probe tip flatness of 25 um or better. This is because the vertical positioning of the probe carrier plates can be adjusted during pick and place assembly to a precision lower than 5 um.

Figure 3A:
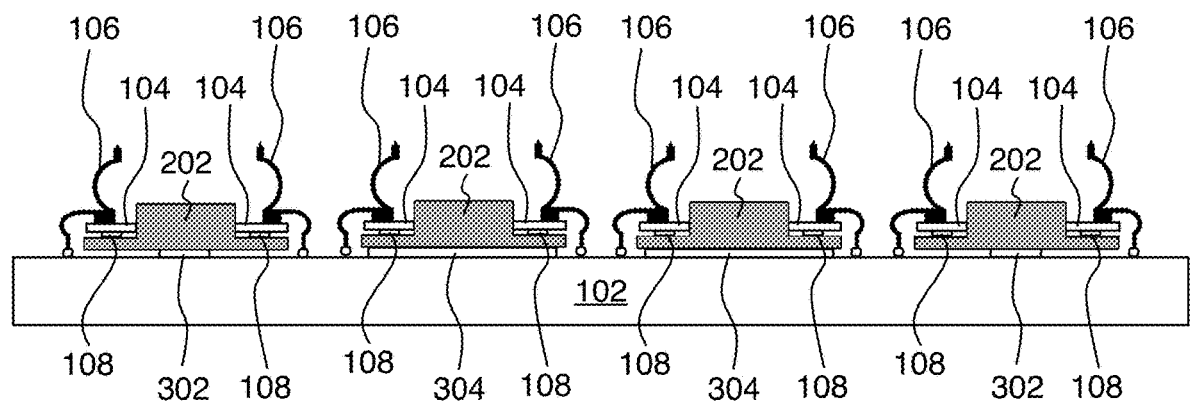
FIGS. 3A-B show a third embodiment of the invention.
Figure 3B:
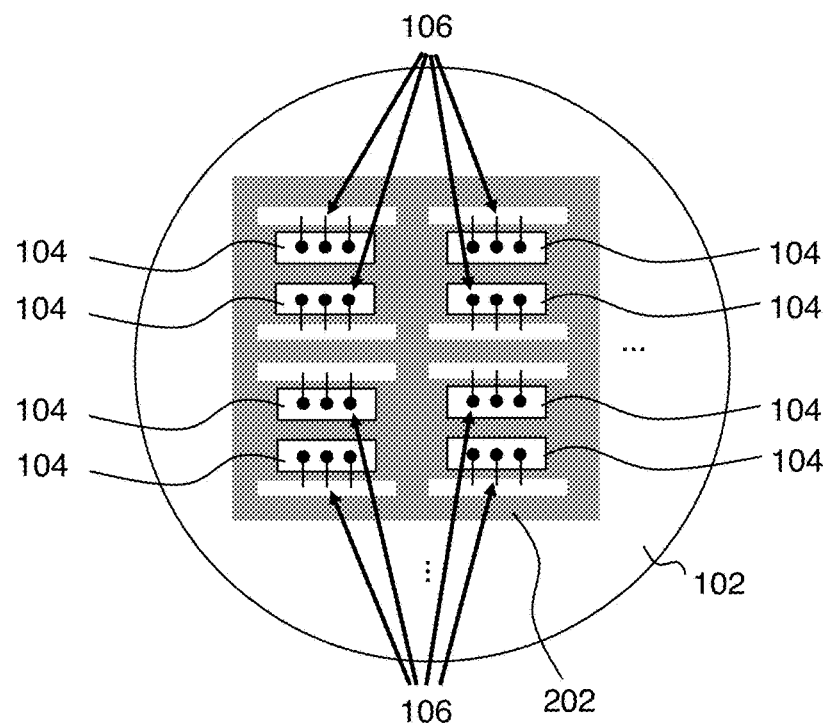

FIGS. 3A-B show a third embodiment of the invention. Here FIG. 3A is a side view and FIG. 3B is a schematically corresponding top view. This is similar to the example of FIGS. 1A-B except that mechanical stiffener member 202 is added to the probe array as shown. Mechanical stiffener 202 is affixed to space transformer 102 with bonds 304. Vertical standoffs 302 can be employed where bonds are not made but vertical support is still provided. Here probe carrier plates 104 are disposed on the mechanical stiffener member 202.

The first flexible members of the vertical probes are configured to accommodate both thermal expansion of the space transformer and deviation of the space transformer from flatness. Suitable materials for mechanical stiffener member 202 in this example are as described above. Bonding of mechanical stiffener member 202 to space transformer 102 in this example can be done using the same bonding techniques as above, but here the design goal is different. More specifically, the bond area in this example is minimized because the design goal is to let space transformer 102 move because of CTE without affecting mechanical stiffener member 202. That is why FIG. 3A shows a mixture of bonds 304 and non-bonding vertical standoffs 302.

In contrast, the design goal of the example of FIGS. 2A-B is for the mechanical stiffener member 202 to constrain CTE motion of the space transformer 102 by forming a uniformly bonded assembly having more desirable CTE properties. So in the example of FIGS. 2A-B there are no non-bonding vertical standoffs, and bond area is maximized to form that uniformly bonded assembly.

Figure 4:
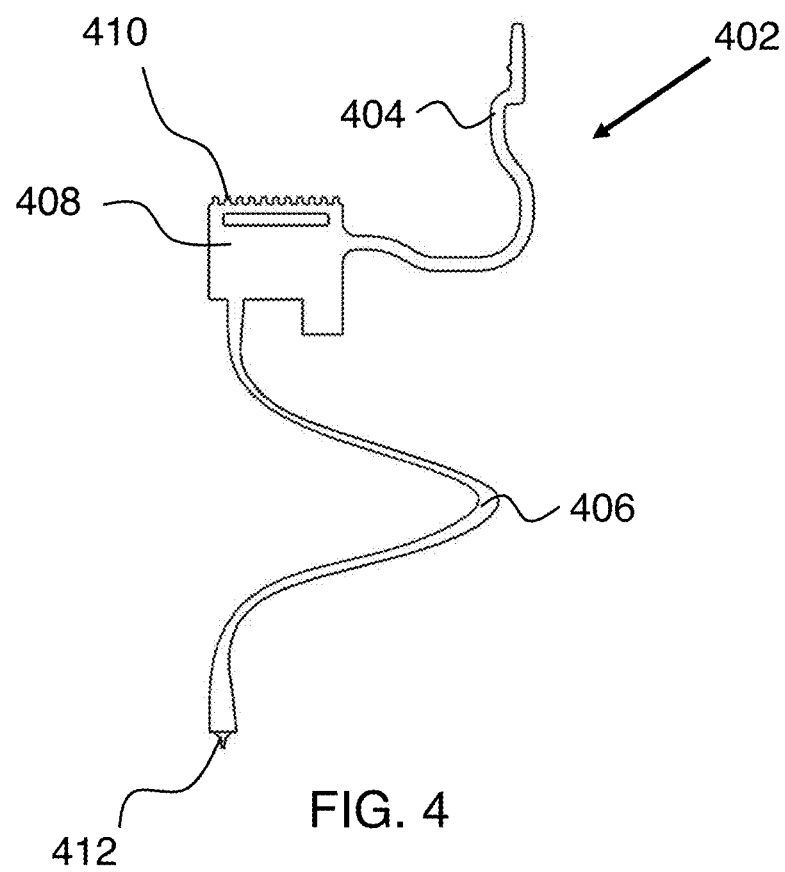
FIG. 4 shows an exemplary vertical probe for use in embodiments of the invention.

As indicated above, probes for use in embodiments of the invention are vertical probes. FIG. 4 shows an exemplary vertical probe for use in embodiments of the invention. In this example, probe 402 includes a first flexible member 404 and a second flexible member 406. At the end of second flexible member 406 is a tip 412 for making temporary contact to a device under test. First flexible member 404 makes a mechanically compliant electrical connection to the space transformer. The probe of this example also includes a probe body 408 configured to be mechanically affixed to a probe carrier plate. Optionally, an attachment feature 410 can be included, e.g., to improve retention of bonding adhesive etc. In most cases, the probes are electrically insulated from the probe carrier plates, to preserve electrical independence of probes that are affixed to the same probe carrier plate.

Here a vertical probe is any probe whose primary motion when elastically deformed while probing a device under test is shortening of a vertical dimension of the probe. The vertical probe makes contact with the Device Under Test (DUT) in the vertical direction. This can be contrasted with cantilever probes, where the primary probe motion is deflection of a beam member, and no dimension of the probe is substantially shortened and contact with the DUT is made in the horizontal direction.

The vertical probes are preferably 2D MEMS (microelectromechanical systems) probes. Here MEMS probes are defined as any probes fabricated with MEMS technology, especially in silicon. This fabrication technology is preferred because it provides the flexibility to fabricate relatively complicated probe shapes (e.g., as in the example of FIG. 4).

Vertical probes can provide substantial advantages in practice, such as large vertical deflection (e.g., 150 um), predictable scrub behavior of the probe tip when making contact to devices under test (without punch through of DUT contact pads), smaller DUT size and greater flexibility in contact pad layout of devices under test.

The invention claimed is:

1. A probe array for testing electrical devices, the probe array comprising:
 a space transformer;
 two or more probe carrier plates disposed on or in proximity to the space transformer;
 wherein each probe carrier plate has two or more vertical probes disposed on it;
 wherein each vertical probe includes a first flexible member that makes electrical contact to the space transformer;
 wherein each vertical probe includes a second flexible member configured to make temporary electrical contact to a device under test;
 wherein each vertical probe includes a probe body affixed to a corresponding one of the two or more carrier plates;
 wherein for each vertical probe, its probe body and its first flexible member and its second flexible member are monolithic parts of the corresponding vertical probe.

2. The probe array of claim 1, further comprising a mechanical stiffener member affixed to the space transformer.

3. The probe array of claim 2, wherein the probe carrier plates are disposed on the space transformer, and wherein the mechanical stiffener member is configured to constrain both thermal expansion of the space transformer and deviation of the space transformer from flatness.

4. The probe array of claim 2, wherein the probe carrier plates are disposed on the mechanical stiffener member, and wherein the first flexible members of the vertical probes are configured to accommodate both thermal expansion of the space transformer and deviation of the space transformer from flatness.

5. The probe array of claim 1, wherein the vertical probes are 2D MEMS probes.

6. The probe array of claim 1, wherein the space transformer includes a ceramic substrate.

7. The probe array of claim 1, wherein the space transformer includes a printed circuit board substrate.

8. The probe array of claim 1, wherein a probe array formed by tips of the second flexible members of the vertical probes is flat to a tolerance of 25 microns or less.

* * * * *